United States Patent
Adusumilli et al.

(10) Patent No.: US 9,997,416 B2
(45) Date of Patent: Jun. 12, 2018

(54) LOW RESISTANCE DUAL LINER CONTACTS FOR FIN FIELD-EFFECT TRANSISTORS (FINFETS)

(71) Applicant: International Business Machines Corporation, Armonk, NY (US)

(72) Inventors: Praneet Adusumilli, Albany, NY (US); Veeraraghavan S. Basker, Schenectady, NY (US); Zuoguang Liu, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/628,329

(22) Filed: Jun. 20, 2017

(65) Prior Publication Data
US 2017/0352597 A1    Dec. 7, 2017

Related U.S. Application Data

(62) Division of application No. 15/171,486, filed on Jun. 2, 2016, now Pat. No. 9,768,077.

(51) Int. Cl.
*H01L 21/8238*    (2006.01)
*H01L 21/321*    (2006.01)
(Continued)

(52) U.S. Cl.
CPC .............. *H01L 21/823814* (2013.01); *H01L 21/32115* (2013.01); *H01L 21/76865* (2013.01);
(Continued)

(58) Field of Classification Search
CPC ....... H01L 21/823814; H01L 21/76865; H01L 21/823821; H01L 21/823864;
(Continued)

(56) References Cited

U.S. PATENT DOCUMENTS

| | | | |
|---|---|---|---|
| 6,063,681 A | 5/2000 | Son | |
| 6,420,784 B2 | 7/2002 | Hu et al. | |
| 6,667,552 B1 | 12/2003 | Buynoski | |
| 7,129,548 B2 | 10/2006 | Chan et al. | |

(Continued)

FOREIGN PATENT DOCUMENTS

DE    102004054597 A1    5/2006

OTHER PUBLICATIONS

D. Erbetta et al., "Cobalt Silicide Formation Characteristics in a Single Wafer Rapid Thermal Furnace (SRTF) System," 14th IEEE International Conference on Advanced Thermal Processing of Semiconductors, 2006, 2 pages.

(Continued)

*Primary Examiner* — Caleen Sullivan
(74) *Attorney, Agent, or Firm* — Vazken Alexanian; Ryan, Mason & Lewis, LLP

(57) ABSTRACT

A semiconductor device includes first and second gate structures on a substrate respectively corresponding to an n-type and a p-type transistor, a first source/drain on the substrate corresponding to the n-type transistor, a second source/drain on the substrate corresponding to the p-type transistor, a first contact trench over the first source/drain and adjacent the first gate structure, a second contact trench over the second source/drain and adjacent the second gate structure, a first liner layer in the first trench positioned at a bottom part of the first trench, a second liner layer in the second trench and on the first liner layer in the first trench, a metallization layer in the first and second trenches on the second liner layer, and a first silicide contact between the first liner layer and the first source/drain and a second silicide contact between the second liner layer and the second source/drain.

20 Claims, 6 Drawing Sheets

PFET

(51) Int. Cl.
*H01L 21/768* (2006.01)
*H01L 23/522* (2006.01)
*H01L 23/532* (2006.01)
*H01L 27/092* (2006.01)

(52) U.S. Cl.
CPC ........ *H01L 21/823821* (2013.01); *H01L 21/823864* (2013.01); *H01L 21/823871* (2013.01); *H01L 23/5226* (2013.01); *H01L 23/53228* (2013.01); *H01L 23/53242* (2013.01); *H01L 23/53257* (2013.01); *H01L 27/0924* (2013.01)

(58) Field of Classification Search
CPC ......... H01L 21/823871; H01L 27/0924; H01L 23/5226; H01L 23/53228; H01L 23/53257; H01L 23/53242; H01L 21/32115
USPC ........................................................ 257/369
See application file for complete search history.

(56) References Cited

U.S. PATENT DOCUMENTS

| | | | |
|---|---|---|---|
| 9,129,889 | B2 | 9/2015 | Padmanabhan et al. |
| 9,196,694 | B2 | 11/2015 | Bouche et al. |
| 9,548,250 | B1 | 1/2017 | Basker et al. |
| 2006/0163670 | A1 | 7/2006 | Ellis-Monaghan et al. |
| 2011/0241116 | A1 | 10/2011 | Lavoie et al. |
| 2012/0139053 | A1 | 6/2012 | Ando et al. |
| 2014/0264369 | A1 | 9/2014 | Padmanabhan et al. |
| 2014/0264454 | A1 | 9/2014 | Banerjee et al. |
| 2015/0091093 | A1* | 4/2015 | Bouche ............ H01L 29/41725 257/369 |
| 2015/0214228 | A1 | 7/2015 | Koh et al. |
| 2015/0340482 | A1 | 11/2015 | Padmanabhan et al. |
| 2016/0035574 | A1 | 2/2016 | Alptekin et al. |

OTHER PUBLICATIONS

List of IBM Patents or Patent Applications Treated as Related.

* cited by examiner

LOW RESISTANCE DUAL LINER CONTACTS FOR FIN FIELD-EFFECT TRANSISTORS (FINFETS)

TECHNICAL FIELD

The field generally relates to semiconductor devices and methods of manufacturing same and, in particular, to forming a first liner for n-type contacts, and a second liner for p-type contacts.

BACKGROUND

When scaling for next generation complementary metal-oxide semiconductor (CMOS) devices in connection with increased miniaturization, including, for example, very-large-scale integration (VLSI), middle-of-the-line (MOL) resistance can be a critical issue affecting device performance. Scaling of CMOS devices calls for independently reducing contact resistance of both n-type field-effect transistors (NFETs) and p-type field-effect transistors (PFETs), which requires different silicides for NFETs and PFETs, to independently achieve low contact resistance on both an NFET and a PFET, respectively.

Deposition of multiple liner silicides in a contact area trench can lead to unwanted extra liner deposition on contacts that results in a significant loss of available area in a trench for a gap fill metal contact and a subsequent increase in interconnect resistance.

SUMMARY

According to an exemplary embodiment of the present invention, a method for manufacturing a semiconductor device includes forming a first source/drain on a substrate corresponding to an n-type transistor, forming a second source/drain on a substrate corresponding to a p-type transistor, forming a first contact trench over the first source/drain, forming a second contact trench over the second source/drain, depositing a first liner layer in the first and second trenches, removing a portion of the first liner layer from each of the first and second trenches, wherein a remainder of the first liner layer in the first trench and a remainder of the first liner layer in the second trench are respectively positioned at a bottom part of the first and second trenches, removing the remainder of the first liner layer from the second trench, depositing a second liner layer in the second trench and on the remainder of the first liner layer in the first trench, depositing a metallization layer in the first and second trenches on the second liner layer, and forming a first silicide contact between the first liner layer and the first source/drain and a second silicide contact between the second liner layer and the second source/drain.

According to an exemplary embodiment of the present invention, a semiconductor device includes a substrate, a first gate structure on the substrate corresponding to an n-type transistor, a second gate structure on the substrate corresponding to a p-type transistor, a first source/drain on the substrate corresponding to the n-type transistor, a second source/drain on the substrate corresponding to the p-type transistor, a first contact trench over the first source/drain and adjacent the first gate structure, a second contact trench over the second source/drain and adjacent the second gate structure, a first liner layer in the first trench positioned at a bottom part of the first trench, a second liner layer in the second trench and on the first liner layer in the first trench, a metallization layer in the first and second trenches on the second liner layer, and a first silicide contact between the first liner layer and the first source/drain and a second silicide contact between the second liner layer and the second source/drain.

According to an exemplary embodiment of the present invention, a method for manufacturing a semiconductor device includes forming a first gate structure on a substrate corresponding to an n-type transistor, forming a second gate structure on a substrate corresponding to a p-type transistor, forming a first contact trench adjacent the first gate structure over a first source/drain corresponding to the n-type transistor, forming a second contact trench adjacent the second gate structure over a second source/drain corresponding to the p-type transistor, depositing a first liner layer in the first and second trenches, removing a portion of the first liner layer from each of the first and second trenches, wherein a remainder of the first liner layer in the first trench and a remainder of the first liner layer in the second trench are respectively positioned at a bottom part of the first and second trenches, removing the remainder of the first liner layer from the second trench, depositing a second liner layer in the second trench and on the remainder of the first liner layer in the first trench, depositing a metallization layer in the first and second trenches on the second liner layer, and annealing to form a first contact between the first liner layer and the first source/drain and a second contact between the second liner layer and the second source/drain.

These and other exemplary embodiments of the invention will be described in or become apparent from the following detailed description of exemplary embodiments, which is to be read in connection with the accompanying drawings.

BRIEF DESCRIPTION OF THE DRAWINGS

Exemplary embodiments of the present invention will be described below in more detail, with reference to the accompanying drawings, of which.

DETAILED DESCRIPTION

Figure 1A:
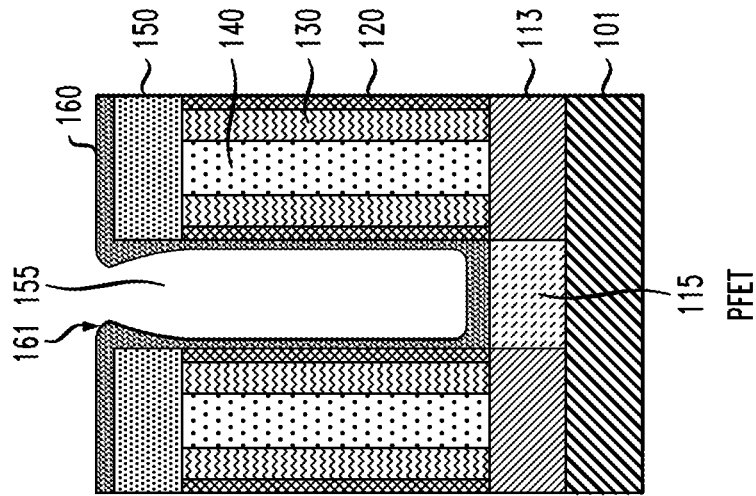
FIGS. 1A and 1B are cross-sectional views illustrating fabrication of a semiconductor device taken perpendicular to a gate extension direction and showing deposition of a first liner layer in source/drain contact regions of NFET and PFET portions, according to an exemplary embodiment of the present invention.

Exemplary embodiments of the invention will now be discussed in further detail with regard to semiconductor devices and methods of manufacturing same and, in particular, to forming a first liner silicide for NFET source/drain contacts, and a second liner silicide for PFET source/drain contacts.

It is to be understood that the various layers and/or regions shown in the accompanying drawings are not drawn to scale, and that one or more layers and/or regions of a type commonly used in complementary metal-oxide semiconductor (CMOS), fin field-effect transistor (FinFET), metal-oxide-semiconductor field-effect transistor (MOSFET) and/or other semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that may require CMOSs, MOSFETs and/or FinFETs. By way of non-limiting example, the semiconductor devices can include, but are not limited to CMOS, MOSFET and FinFET devices, and/or semiconductor devices that use CMOS, MOSFET and/or FinFET technology.

As used herein, "parallel to a gate extension direction" refers to an extension direction of a gate structure perpendicular to a channel length (e.g., perpendicular to a fin extension direction).

As used herein, "perpendicular to a gate extension direction" or "across a channel of a gate structure" refers to a channel length direction of a gate structure (e.g., parallel to a fin extension direction) and to the left and right in the cross-sectional views herein, wherein source/drain regions are located to left and right sides of the gate structure in the cross-sectional views. In other words, left and right in these cross-sections represents a length of a fin and a channel length, and the width direction of the fin and a gate extension direction are going into the page.

As used herein, "height" refers to a vertical size of an element (e.g., a layer, trench, hole, etc.) in the cross-sectional views measured from a bottom surface to a top surface of the element, and/or measured with respect to a surface on which the element is directly on. Conversely, a "depth" refers to a vertical size of an element (e.g., a layer, trench, hole, etc.) in the cross-sectional and three-dimensional views measured from a top surface to a bottom surface of the element.

As used herein, "lateral," "lateral side," "lateral surface" refers to a side surface of an element (e.g., a layer, opening, etc.), such as a left or right side surface in the drawings.

As used herein, "width" or "length" refers to a size of an element (e.g., a layer, trench, hole, etc.) in the drawings measured from a side surface to an opposite surface of the element.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to a substrate in the cross-sectional views, and "horizontal" refers to a direction parallel to a substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

In accordance with an embodiment of the present invention, Ti (titanium) liner silicide provides low contact resistance for NFET contacts, and NiPt/Ti (nickel platinum/titanium) and Co/Ti (cobalt/titanium) liner silicides provide low contact resistance for PFET contacts, while mitigating the risk of encroachment, where elements, such as, for example, nickel, diffuse into spacers, epitaxial regions under spacers and/or into channel regions, that can be present with conventional silicide contacts. Embodiments of the present invention provide a semiconductor device and method of manufacturing the same, which results in a Ti liner silicide for NFET source/drain contacts, and NiPt/Ti or Co/Ti liner silicides for PFET source/drain contacts.

Figure 1B:
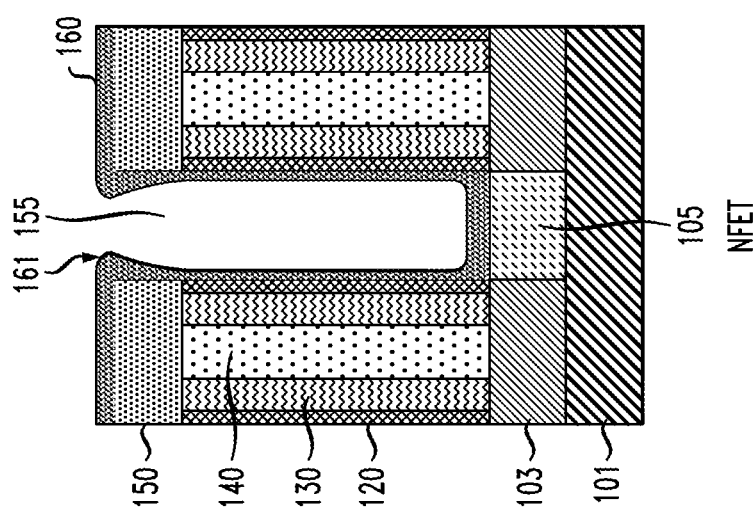

FIGS. 1A and 1B are cross-sectional views illustrating fabrication of a semiconductor device taken perpendicular to a gate extension direction and showing deposition of a first liner layer in source/drain contact regions of NFET and PFET portions, according to an exemplary embodiment of the present invention. Referring to FIGS. 1A and 1B, a semiconductor substrate 101 can be, for example, a bulk substrate or a silicon-on-insulator (SOI) substrate including a buried insulating layer, such as, for example, a buried oxide or nitride layer located on an upper surface of the semiconductor substrate. The substrate 101 may comprise semiconductor material including, but not limited to, Si, SiGe, SiC, SiGeC or other like semiconductor. In addition, multiple layers of the semiconductor materials can be used as the semiconductor material of the substrate. FIGS. 1A and 1B respectively represent NFET and PFET devices on the substrate 101. While FIGS. 1A and 1B (and FIGS. 2A, 3A, 4A, 5A, 6A and 2B, 3B, 4B, 5B, 6B) are drawn separately, it is to be understood that the respective NFET and PFET portions can be on the same substrate, or, at the very least, in proximity to each other to allow for simultaneous processing, so that when a layer is deposited on or removed from an NFET portion, the layer can also be simultaneously deposited on or removed from a PFET portion. Further, although one NFET and one PFET portion are shown, the embodiments of the invention are not necessarily limited thereto, and may include multiple NFET and PFET portions on which processing can be performed.

In accordance with an embodiment of the present invention, as can be seen in FIGS. 1A and 1B, fins 103 and 113 are formed on the substrate 101, using, for example, known methods of epitaxial growth and patterning. According to an embodiment, a fin 103 of an NFET includes, for example, silicon, and a source/drain 105 of the NFET adjacent one or more gate structures, includes doped silicon (Si), such as, but not necessarily limited to, phosphorous or arsenic doped silicon. According to an embodiment, a fin 113 of a PFET includes, for example, silicon germanium (SiGe), and a source/drain 115 of the PFET adjacent one or more gate structures, includes doped SiGe, such as, but not necessarily limited to, boron or gallium doped SiGe.

As is known in the art, a fin of a FinFET is a conducting channel that protrudes vertically from a substrate and extends in a direction from a source to a drain. As can be understood by one of ordinary skill in the art, a plurality of fins can be formed on the substrate 102 and spaced apart from each other at regular intervals along a gate extension direction. A plurality of gates can intersect the fins and extend perpendicular to the extension direction of the fins. Multiple gates can be spaced apart from each other along the extension direction of the fins.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), liquid-phase epitaxy (LPE), molecular beam epitaxy (MBE) and metal-organic chemical vapor deposition (MOCVD). The temperature for an epitaxial growth process can range from, for example, 550° C. to 900° C., but is not necessarily limited thereto, and may be conducted at higher or lower temperatures as needed.

A number of different sources may be used for the epitaxial growth. For example, the sources may include precursor gas or gas mixture including for example, a silicon containing precursor gas (such as silane) and/or a germanium containing precursor gas (such as a germane). Carrier gases like hydrogen, nitrogen, helium and argon can be used.

In an RMG process, a sacrificial material, which is replaced by a metal gate structure, is used to determine a geometry and location of the resulting metal gate structure (s). The sacrificial gate structure can comprise a material that can be selectively etched with respect to adjacent layers. For example, the sacrificial gate structure may comprise silicon, such as, polysilicon, and may be deposited and patterned. The sacrificial gate structure can be deposited using deposition techniques including, but not limited to, chemical vapor deposition (CVD), plasma enhanced CVD (PECVD), radio-frequency CVD (RFCVD), physical vapor deposition (PVD), atomic layer deposition (ALD), molecular beam deposition (MBD), pulsed laser deposition (PLD), and/or liquid source misted chemical deposition (LSMCD), sputtering, and/or plating.

During the RMG process, spacers 130 are formed adjacent to the sacrificial gate structure, to be in direct contact with opposing sidewalls of the sacrificial gate structure. The spacers 130 can include a dielectric insulating material such as, for example, silicon dioxide ($SiO_2$), silicon nitride (SiN), silicon oxynitride (SiON), boron nitride (BN), silicon boron nitride (SiBN), siliconborocarbonitride (SiBCN), silicon oxycarbonitride (SiOCN) or multilayered stacks thereof. Spacer liner layers 120 are formed adjacent the spacer layers 130, and include, for example, SiN, SiON, SiBCN, or SiOCN.

The sacrificial gate structure is removed to provide an opening exposing a portion of the fin 103 or 113 and in which the resulting gate structures 140 are to be formed. The sacrificial gate structure can be removed using a selective etch process that selectively removes the sacrificial gate structure with respect to the spacer liner layers 120 and spacers 130. The etch can be, for example, an isotropic etch, such as a wet chemical etch, or an anisotropic etch, such as reactive ion etching (RIE), ion beam etching, plasma etching or laser ablation.

A metal gate structure is formed in the opening left after removal of the sacrificial gate structure. Referring to FIGS. 1A and 1B, the gate structures 140 are formed on the fins 103, 113. A gate structure 140 includes, for example, low resistance metal, such as, for example, tungsten, cobalt, zirconium, tantalum, titanium, aluminum, ruthenium, copper, metal carbides, metal nitrides, transition metal aluminides, tantalum carbide, titanium carbide, tantalum magnesium carbide, or combinations thereof, and a dielectric such as, for example, a high-K dielectric including but not limited to, $HfO_2$ (hafnium oxide), $ZrO_2$ (zirconium dioxide), hafnium zirconium oxide $Al_2O_3$ (aluminum oxide), and $Ta_2O_5$ (tantalum pentoxide). The gate structure may be formed using, for example, deposition techniques including, but not limited to, CVD, PECVD, RFCVD, PVD, ALD, MBD, PLD, and/or LSMCD, sputtering, and/or plating. The spacers 130 are located on the metal gate structure, having a first edge located on a vertical sidewall the gate structure and a base that is located on the fins 103, 113. As can be understood by one of ordinary skill in the art, a plurality of gate structures can be formed on one or more fins, and spaced apart from each other along a length (e.g., extension) direction of the fins. Dielectric layers 150, such as, but not necessarily limited to, SiN, are formed on spacer liner layers 120, the spacers 130, and on the gate structures 140. The dielectric layers 150 are formed using a deposition method, such as, for example, CVD, PECVD, RFCVD, PVD, ALD, MBD, PLD, and/or LSMCD, sputtering, and/or plating.

Trenches 155, where source/drain contact regions are to be formed, are located adjacent the gate structures 140. The trenches 155 can be formed by a lithography step first, then reactive ion etching (RIE) is used to open the trenches 155 next to spacer liner layers 120. According to a non-limiting embodiment, a width of the trenches can be in a range of about 18 nm to about 25 nm.

A first liner layer 160 is conformally deposited in the trenches 155 and on the dielectric layers 150 in both the NFET and PFET portions. According to an embodiment of the present invention, the first liner layer 160 comprises a layer of titanium (Ti) deposited using, for example, PVD, CVD or ALD, and a layer of titanium nitride (TiN) deposited on the titanium using, for example, ALD. According to a non-limiting embodiment of the present invention, the layer of titanium is about 3 nm to about 8 nm thick, and the layer of titanium nitride is about 3 nm to about 5 nm thick. As can be seen in FIGS. 1A and 1B, a liner overhang 161 of excess liner material is formed near the top of a trench 155, which, if not removed, can lead to a pinch off effect, where a metallization layer for the source/drain contact is blocked by the overhang, and not able to fill the trench 155. A method of forming a semiconductor device, in accordance with an embodiment of the present invention, removes the liner overhangs.

Figure 2A:
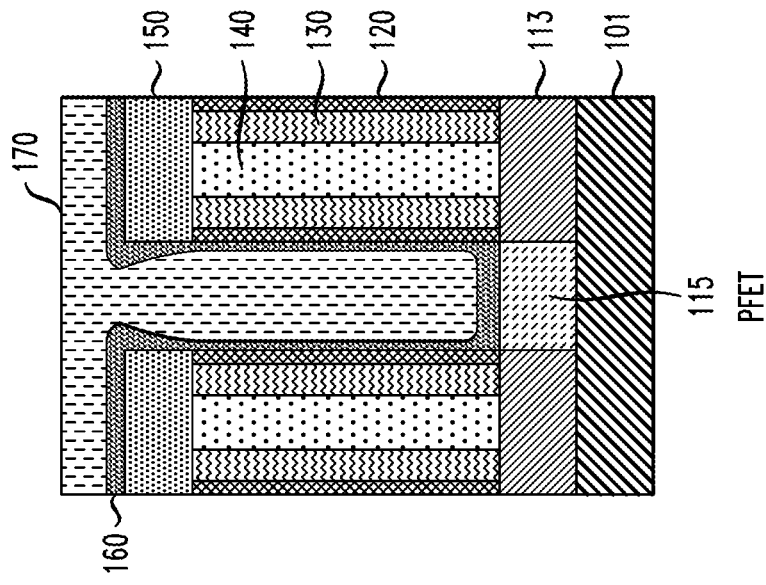
FIGS. 2A and 2B are cross-sectional views illustrating fabrication of a semiconductor device taken perpendicular to a gate extension direction and showing deposition of an organic planarization layer (OPL) on NFET and PFET portions, according to an exemplary embodiment of the present invention.
Figure 2B:
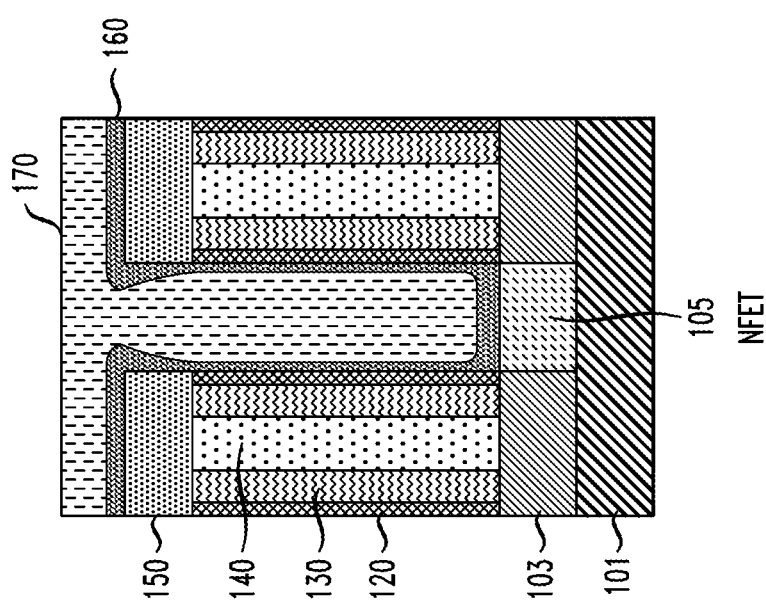

FIGS. 2A and 2B are cross-sectional views illustrating fabrication of a semiconductor device taken perpendicular to a gate extension direction and showing deposition of an organic planarization layer (OPL) on NFET and PFET portions, according to an exemplary embodiment of the present invention. Referring to FIGS. 2A and 2B, an organic planarization layer (OPL) 170 is formed in each of the trenches 155 on the first liner layer 160, and on the dielectric layers 150. In accordance with an embodiment of the present invention, the OPL material may be an organic polymer including, for example, carbon (C), hydrogen (H), and nitrogen (N). The OPL material is capable of generating etch residues during an RIE process that is re-deposited on unetched portions of the OPL. In an embodiment, the OPL material can be free of fluorine (F). In another embodiment, the OPL material can be free of silicon (Si). As defined herein, a material is free of an atomic element when the level of the atomic element in the material is at or below a trace level detectable with analytic methods available in the art. In another embodiment, the OPL material may be free of Si and F. Non-limiting examples of the OPL material include JSR HM8006, JSR HM8014, AZ UM10M2, Shin Etsu ODL 102, or other similar commercially available materials from such vendors as JSR, TOK, Sumitomo, Rohm & Haas, etc. The OPL material can be deposited, for example, by spin coating.

Figure 3A:
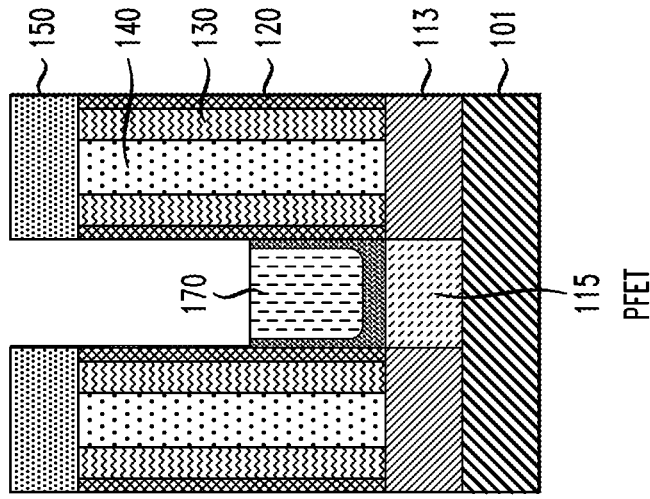
FIGS. 3A and 3B are cross-sectional views illustrating fabrication of a semiconductor device taken perpendicular to a gate extension direction and showing recessing of the OPL and removal of part of the first liner layer in NFET and PFET portions, according to an exemplary embodiment of the present invention.
Figure 3B:
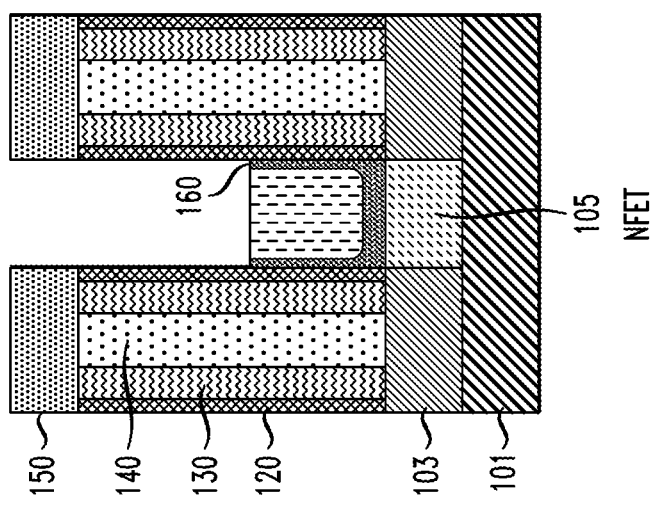

FIGS. 3A and 3B are cross-sectional views illustrating fabrication of a semiconductor device taken perpendicular to a gate extension direction and showing recessing of the OPL and removal of part of the first liner layer in NFET and PFET portions, according to an exemplary embodiment of the present invention. Referring to FIGS. 3A and 3B, the OPL 170 is recessed using, for example, RIE, oxygen plasma, nitrogen plasma, hydrogen plasma or other carbon strip process. A stripping process, for example, a room temperature standard clean-1 (RT-SC1) strip, is then performed to remove the first liner layer 160 from the dielectric layers 150, and from a portion of the sidewall of each trench 155 above the recessed OPL 170 as shown. SC1 can be performed using deionized water, aqueous $NH_4OH$ (ammonium hydroxide) and aqueous $H_2O_2$ (hydrogen peroxide). SC1 can be used in the range of 100:1:1 to 5:1:1 (deionized water:hydrogen peroxide:ammonium hydroxide). Referring to FIGS. 3A and 3B, according to an embodiment of the present invention, the remaining portions of the OPL 170 and first liner layers 160 are closer to a bottom than to a top part of each of the trenches 155.

Figure 4B:
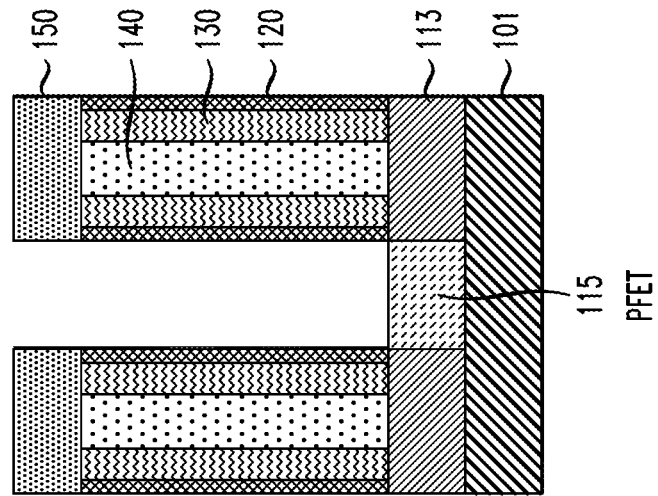
FIG. 4B is a cross-sectional view illustrating fabrication of a semiconductor device taken perpendicular to a gate extension direction and showing removal of remaining portions of the OPL and first liner layer from a PFET portion, according to an exemplary embodiment of the present invention.
Figure 4A:
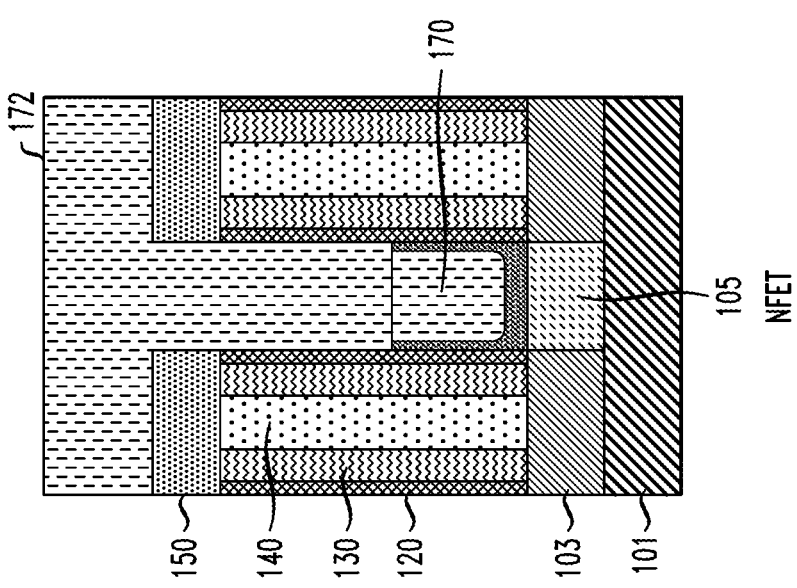
FIG. 4A is a cross-sectional view illustrating fabrication of a semiconductor device taken perpendicular to a gate extension direction and showing deposition of a soft mask on an NFET portion, according to an exemplary embodiment of the present invention.

FIG. 4A is a cross-sectional view illustrating fabrication of a semiconductor device taken perpendicular to a gate extension direction and showing deposition of a soft mask on an NFET portion, according to an exemplary embodiment of the present invention. Referring to FIG. 4A, another OPL 172 is formed on the NFET portion in trench 155 on the remaining first liner layer 160 and OPL 170, and on the dielectric layers 150. The OPL 172 acts as a soft mask protecting the remaining first liner layer 160 on the source/drain 105 of the NFET portion. The OPL 172 can include the same or similar material(s) as the OPL 170, and is deposited using, for example, a spin coating process.

FIG. 4B is a cross-sectional view illustrating fabrication of a semiconductor device taken perpendicular to a gate extension direction and showing removal of remaining portions of the OPL 170 and first liner layer 160 from a PFET portion, according to an exemplary embodiment of the present invention. While the NFET portion is protected by the OPL 172, remaining portions of the OPL 170 and first liner layer 160 are removed from the PFET portion, as shown in FIG. 4B. Referring to FIG. 4B, the remaining OPL 170 is recessed using, for example, oxygen plasma, nitrogen plasma, hydrogen plasma or other carbon strip process, and a stripping process, for example, RT-SC1, is then performed to remove the remaining first liner layer 160 from the trench 155 of the PFET portion.

Figure 5B:
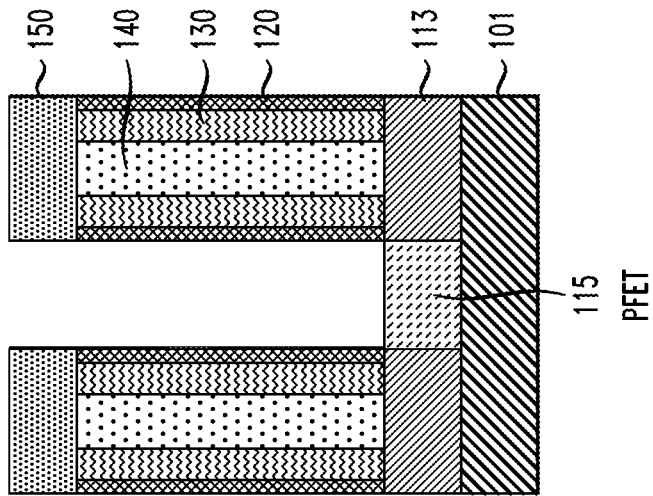
FIG. 5B is a cross-sectional view, which is the same as FIG. 4B, showing the result of removal of the remaining portions of the OPL and first liner layer from a PFET portion as compared with the structure of the NFET portion in FIG. 5A, according to an exemplary embodiment of the present invention.
Figure 5A:
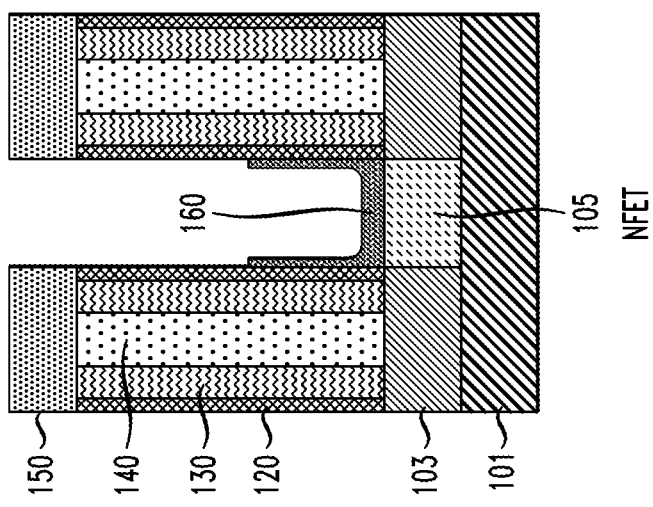
FIG. 5A is a cross-sectional view illustrating fabrication of a semiconductor device taken perpendicular to a gate extension direction and showing removal of the soft mask from an NFET portion, according to an exemplary embodiment of the present invention.

FIG. 5A is a cross-sectional view illustrating fabrication of a semiconductor device taken perpendicular to a gate extension direction and showing removal of the soft mask from an NFET portion, according to an exemplary embodiment of the present invention. Referring to FIG. 5A, the OPLs 170 and 172 re removed from the NFET portion using, for example, RIE or an N2-H2 ashing process, leaving the remaining first liner layer 160 in the trench 155 on the source/drain 105 of the NFET portion. FIG. 5B is a cross-sectional view, which is the same as FIG. 4B, showing the result of removal of the remaining portions of the OPL 170 and first liner layer 160 from a PFET portion as compared with the structure of the NFET portion in FIG. 5A, according to an exemplary embodiment of the present invention.

Figure 6A:
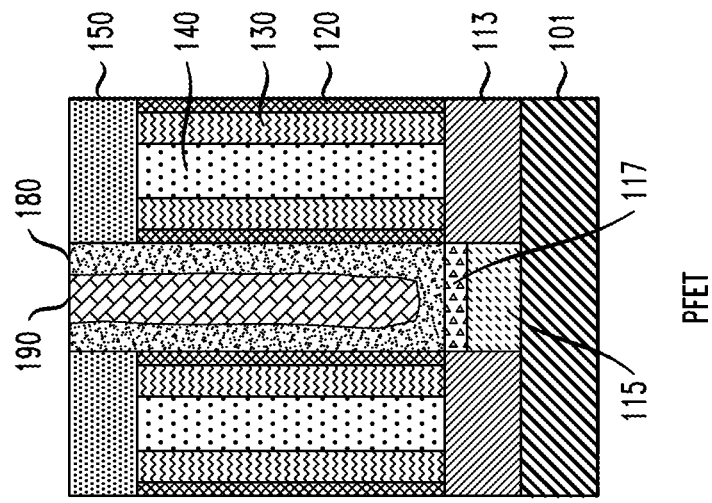
FIGS. 6A and 6B are cross-sectional views illustrating fabrication of a semiconductor device taken perpendicular to a gate extension direction and showing deposition of a second liner layer, metallization, planarization and silicide annealing on NFET and PFET portions, according to an exemplary embodiment of the present invention.
Figure 6B:
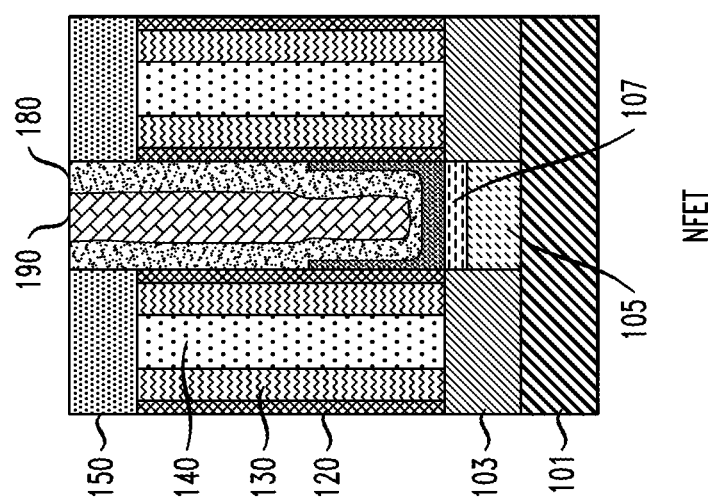

FIGS. 6A and 6B are cross-sectional views illustrating fabrication of a semiconductor device taken perpendicular to a gate extension direction and showing deposition of a second liner layer, metallization, planarization and silicide annealing on NFET and PFET portions, according to an exemplary embodiment of the present invention. Referring to FIGS. 6A and 6B, a second liner layer 180 is conformally deposited in the trenches 155 and on the dielectric layers 150 in both the NFET and PFET portions. FIGS. 6A and 6B show a structure after planarization, so the second liner layer 180 is not shown on the dielectric layers 150. The second liner layer 180 is deposited on the first liner layer 160 in the NFET portion, and on the source/drain 115 of the PFET portion. According to an embodiment of the present invention, the second liner layer 180 comprises a layer of nickel platinum (NiPt) or a layer of cobalt (Co) deposited using, for example, PVD, CVD or ALD, a layer of titanium (Ti) deposited on the NiPt or Co using, for example, PVD, CVD or ALD, and a layer of titanium nitride (TiN) deposited on the titanium using, for example, ALD. According to a non-limiting embodiment of the present invention, the layer of nickel platinum or cobalt is about 1 nm to about 5 nm thick, the layer of titanium is about 3 nm to about 8 nm thick, and the layer of titanium nitride is about 3 nm to about 5 nm thick.

A metallization layer 190 is deposited on the second liner layer 180 in the NFET and PFET portions. The metallization layer 190 includes, but is not necessarily limited to, tungsten, cobalt, ruthenium, copper, or combinations thereof, and is deposited using, for example, deposition techniques including, but not limited to, CVD, PECVD, RFCVD, PVD, ALD, MBD, PLD, and/or LSMCD, sputtering, and/or plating. Then, a planarization, such as, for example, CMP, is performed to remove the second liner and metallization layers 180, 190 from on the dielectric layers 150 and planarize the existing structure as shown in FIGS. 6A and 6B.

An annealing process, including, but not limited to, a rapid thermal anneal (RTA) or a millisecond laser anneal (MSLA), is then performed to form silicide contacts 107 and 117 in NFET and PFET portions. According to an embodiment, the silicide contact 107 in the NFET portion is a titanium silicide due to the materials comprising the overlying first liner layer 160 and the underlying source/drain 105. The silicide contact 117 in the PFET portion is a nickel platinum or cobalt titanium silicide/germanide due to the materials comprising the overlying second liner layer 180 and the underlying source/drain 115.

Since Ti silicide provides low contact resistance for NFET contacts, and NiPt/Ti and Co/Ti liner silicides provide low contact resistance for PFET contacts, the embodiments of the present invention provide a semiconductor device and method of manufacturing the same, which results in a Ti silicide contact 107 for the NFET source/drain 105, and a NiPt/Ti or Co/Ti silicide contact 117 for the PFET source/drain 115 as shown.

While the embodiments of the present invention are illustrated as a FinFET device, including contact areas connecting to a fin, it is to be understood that the embodiments of the present invention are not necessarily limited to FinFET devices, and can be applied to other semiconductor devices where contact areas connect to source/drain regions of one or more gates.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

We claim:

1. A semiconductor device, comprising:
   a substrate;
   a first gate structure on the substrate corresponding to an n-type transistor;
   a second gate structure on the substrate corresponding to a p-type transistor;
   a first source/drain on the substrate corresponding to the n-type transistor;
   a second source/drain on the substrate corresponding to the p-type transistor;
   a first contact trench over the first source/drain and adjacent the first gate structure;
   a second contact trench over the second source/drain and adjacent the second gate structure;
   a first liner layer in the first trench covering a bottom surface of the first trench and covering sidewalls of the first trench at a bottom part of the first trench;
   a second liner layer in the second trench and on the first liner layer in the first trench;
   a metallization layer in the first and second trenches on the second liner layer; and
   a first contact between the first liner layer and the first source/drain and a second contact between the second liner layer and the second source/drain.

2. The semiconductor device according to claim 1, wherein the first liner layer comprises at least one of titanium and titanium nitride.

3. The semiconductor device according to claim 2, wherein the first liner layer comprises a layer of the titanium nitride on a layer of the titanium.

4. The semiconductor device according to claim 1, wherein the second liner layer comprises at least one of nickel platinum and cobalt.

5. The semiconductor device according to claim 4, wherein the second liner layer further comprises at least one of titanium and titanium nitride.

6. The semiconductor device according to claim 5, wherein the second liner layer comprises a layer of the titanium on a layer of one of the nickel platinum and the cobalt.

7. The semiconductor device according to claim 6, wherein the second liner layer comprises a layer of the titanium nitride on the layer of the titanium.

8. The semiconductor device according to claim 1, wherein the first contact comprises titanium silicide.

9. The semiconductor device according to claim 1, wherein the second contact comprises at least one of a nickel platinum and a cobalt titanium silicide/germanide.

10. The semiconductor device according to claim 1, wherein the metallization layer comprises at least one of tungsten, cobalt, ruthenium and copper.

11. A semiconductor device, comprising:
    a substrate;
    a first gate structure on the substrate corresponding to a first transistor;
    a second gate structure on the substrate corresponding to a second transistor;
    a first source/drain on the substrate corresponding to the first transistor;
    a second source/drain on the substrate corresponding to the second transistor;
    a first contact trench over the first source/drain and adjacent the first gate structure;
    a second contact trench over the second source/drain and adjacent the second gate structure;
    a first liner layer in the first trench covering a bottom surface of the first trench and covering sidewalls of the first trench at a bottom part of the first trench;
    a second liner layer in the second trench and on the first liner layer in the first trench;
    a metallization layer in the first and second trenches on the second liner layer; and a first contact between the first liner layer and the first source/drain and a second contact between the second liner layer and the second source/drain.

12. The semiconductor device according to claim 11, wherein the first liner layer comprises at least one of titanium and titanium nitride.

13. The semiconductor device according to claim 12, wherein the first liner layer comprises a layer of the titanium nitride on a layer of the titanium.

14. The semiconductor device according to claim 11, wherein the second liner layer comprises at least one of nickel platinum and cobalt.

15. The semiconductor device according to claim 14, wherein the second liner layer further comprises at least one of titanium and titanium nitride.

16. The semiconductor device according to claim 15, wherein the second liner layer comprises a layer of the titanium on a layer of one of the nickel platinum and the cobalt.

17. The semiconductor device according to claim 16, wherein the second liner layer comprises a layer of the titanium nitride on the layer of the titanium.

18. The semiconductor device according to claim 11, wherein the first contact comprises titanium silicide.

19. The semiconductor device according to claim 11, wherein the second contact comprises at least one of a nickel platinum and a cobalt titanium silicide/germanide.

20. The semiconductor device according to claim 11, wherein the metallization layer comprises at least one of tungsten, cobalt, ruthenium and copper.

* * * * *